United States Patent
Kim et al.

(10) Patent No.: US 9,906,428 B2
(45) Date of Patent: Feb. 27, 2018

(54) SYSTEM AND METHOD FOR FREQUENCY-DOMAIN WEIGHTED LEAST SQUARES

(71) Applicant: Samsung Electronics Co., Ltd., Gyeonggi-do (KR)

(72) Inventors: Jaeyoung Kim, San Diego, CA (US); Pranav Dayal, San Diego, CA (US); Jungwon Lee, San Diego, CA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/190,900

(22) Filed: Jun. 23, 2016

(65) Prior Publication Data

US 2017/0317913 A1    Nov. 2, 2017

Related U.S. Application Data

(60) Provisional application No. 62/328,862, filed on Apr. 28, 2016.

(51) Int. Cl.
*H04L 25/03* (2006.01)
*H04L 12/26* (2006.01)
*H03F 3/24* (2006.01)
*H03F 1/32* (2006.01)

(52) U.S. Cl.
CPC .......... *H04L 43/50* (2013.01); *H04L 43/0829* (2013.01); *H03F 1/3241* (2013.01); *H03F 1/3247* (2013.01); *H03F 3/24* (2013.01); *H03F 2200/451* (2013.01); *H03F 2201/3224* (2013.01)

(58) Field of Classification Search
CPC .... H03F 1/3247; H03F 2200/451; H03F 3/24; H03F 1/3241; H03F 2201/3224; H03F 2201/3227; H04B 1/0475; H04B 2001/0425; H04B 1/62; H04B 2001/0408; H04L 27/368; H04L 25/03343; H04L 27/2626
USPC ................ 455/114.3, 63.1, 91; 375/297, 296
See application file for complete search history.

(56) References Cited

U.S. PATENT DOCUMENTS

| | | |
|---|---|---|
| 7,873,116 B2 | 1/2011 | Okada et al. |
| 8,548,092 B2 | 10/2013 | Kang et al. |
| 8,862,649 B2 | 10/2014 | Kang |
| 9,190,963 B2 | 11/2015 | Omer et al. |
| 2008/0187072 A1 | 8/2008 | Schell et al. |
| 2011/0170630 A1* | 7/2011 | Silverman ......... H04L 25/03343 375/296 |
| 2013/0257529 A1* | 10/2013 | Komninakis ......... H03F 1/0244 330/149 |

(Continued)

OTHER PUBLICATIONS

Yu, Xin, Contributions to Digital Predistortion of Radio-Frequency Power Amplifiers for Wireless Applications, Erlangen 2012, pp. 142.

(Continued)

*Primary Examiner* — Leila Malek
(74) *Attorney, Agent, or Firm* — The Farrell Law Firm, P.C.

(57) ABSTRACT

A method and apparatus is provided. The method includes determining a training data set comprising input and output data of a power amplifier, determining compensation data by regressing the training data using a frequency domain weighting function, storing the compensation data, and linearizing an output of the power amplifier using the stored compensation data.

18 Claims, 8 Drawing Sheets

(56) References Cited

U.S. PATENT DOCUMENTS

| | | | | |
|---|---|---|---|---|
| 2014/0162576 A1* | 6/2014 | Dufrene | ............... | H03M 1/66 |
| | | | | 455/114.3 |
| 2014/0314181 A1* | 10/2014 | Azadet | ............... | G06F 17/5009 |
| | | | | 375/297 |
| 2015/0023445 A1* | 1/2015 | Camuffo | ............... | H03F 1/02 |
| | | | | 375/268 |
| 2016/0191020 A1* | 6/2016 | Velazquez | ............... | H03H 21/0067 |
| | | | | 341/118 |
| 2016/0241277 A1* | 8/2016 | Rexberg | ............... | H04B 1/0475 |

OTHER PUBLICATIONS

Kim, Wan-Jong, Digital Predistortion Linearization and Crest Factor Reduction for Wideband Applications, Copyright Wan-Jong Kim 2006, pp. 128.

* cited by examiner

SYSTEM AND METHOD FOR FREQUENCY-DOMAIN WEIGHTED LEAST SQUARES

PRIORITY

This application claims priority under 35 U.S.C. § 119(e) to U.S. Provisional Patent Application No. 62/328,862 which was filed in the U.S. Patent and Trademark Office on Apr. 28, 2016, the content of which is incorporated herein by reference.

FIELD

The present disclosure generally relates to a method and apparatus for wireless communication, and more particularly, to a system and method for frequency-domain weighted least squares.

BACKGROUND

Users of electronic devices require increasing functionality in the applications and services provided by the electronic devices and communication networks used to connect those devices. Increasing the bandwidth and reliability of such communication networks is of increasing importance for user satisfaction. One of the challenges faced by wireless communication transmitters is lowering the power consumption used by the power amplifier (PA) of the transmitter while maintaining adequate performance of the transmitter. The power efficiency of a PA normally has an inverse relationship to the linearity of the output of the PA. Achieving higher PA power consumption efficiency may result in an increased error vector magnitude (EVM) which in turn may result in increased data transmission error rates and lower bandwidth to the user. Higher PA power consumption efficiency may also result in increased adjacent channel leakage ratio (ACLR) causing spectral regrowth of unwanted radio frequency (RF) emissions into adjacent frequency bands causing interference with signals in those adjacent bands.

SUMMARY

According to an aspect of the present disclosure, a method and apparatus is provided for non-linear compensation of a PA using a frequency-domain weighted least squares regression that balances the requirements of both the EVM and the ACLR of the PA.

According to an aspect of the present disclosure, a method is provided which includes, but is not limited to, determining a training data set comprising input and output data of a power amplifier, determining compensation data by regressing the training data set using a frequency-domain weighting function, storing the compensation data, and linearizing an output of the power amplifier using the stored compensation data.

According to an aspect of the present disclosure, an electronic device is provided which includes, but is not limited to, a power amplifier, a storage, and a processor configured to determine a training data set comprising input and output data of the power amplifier, determine compensation data by regressing the training data set using a frequency-domain weighting function, store the compensation data in the storage, and linearize an output of the power amplifier using the stored compensation data.

According to an aspect of the present disclosure, a chipset for controlling a user equipment (UE) in a mobile communication system is provided, the chipset configured to determine a training data set comprising input and output data of a power amplifier, determine compensation data by regressing the training data set using a frequency-domain weighting function, store the compensation data in a storage, and linearize an output of the power amplifier using the stored compensation data.

BRIEF DESCRIPTION OF THE DRAWINGS

The above and other aspects, features and advantages of the present disclosure will become more apparent from the following detailed description, when taken in conjunction with the accompanying drawings, in which.

DETAILED DESCRIPTION

The present disclosure will now be described more fully hereinafter with reference to the accompanying drawings, in which embodiments of the present disclosure are shown. This disclosure may, however, be embodied in many different forms and should not be construed as limited to the embodiments set forth herein. Rather, these embodiments are provided so that this disclosure will be thorough and complete, and will fully convey the scope of the device and method to those skilled in the art. In the drawings, the size and relative sizes of layers and regions may be exaggerated for clarity. Like reference numbers refer to like elements throughout.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein, the term "and/or" includes, but is not limited to, any and all combinations of one or more of the associated listed items.

It will be understood that, although the terms first, second, and other terms may be used herein to describe various elements, these elements should not be limited by these terms. These terms are only used to distinguish one element from another. For example, a first signal may be referred to as a second signal, and, similarly, a second signal may be referred to as a first signal without departing from the teachings of the disclosure.

The terminology used herein is for the purpose of describing particular embodiments only and is not intended to be limiting of the present device and method. As used herein, the singular forms "a", "an" and "the" are intended to include the plural forms as well, unless the context clearly indicates otherwise. It will be further understood that the terms "comprises" and/or "comprising," or "includes, but is not limited to" and/or "including, but not limited to" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including, but not limited to technical and scientific terms) used herein have the same meanings as commonly understood by one of ordinary skill in the art to which the present device and method belongs. It will be further understood that terms, such as those defined in commonly used dictionaries, should be interpreted as having meanings that are consistent with their meaning in the context of the relevant art and/or the present description, and will not be interpreted in an idealized or overly formal sense unless expressly so defined herein.

Figure 1:
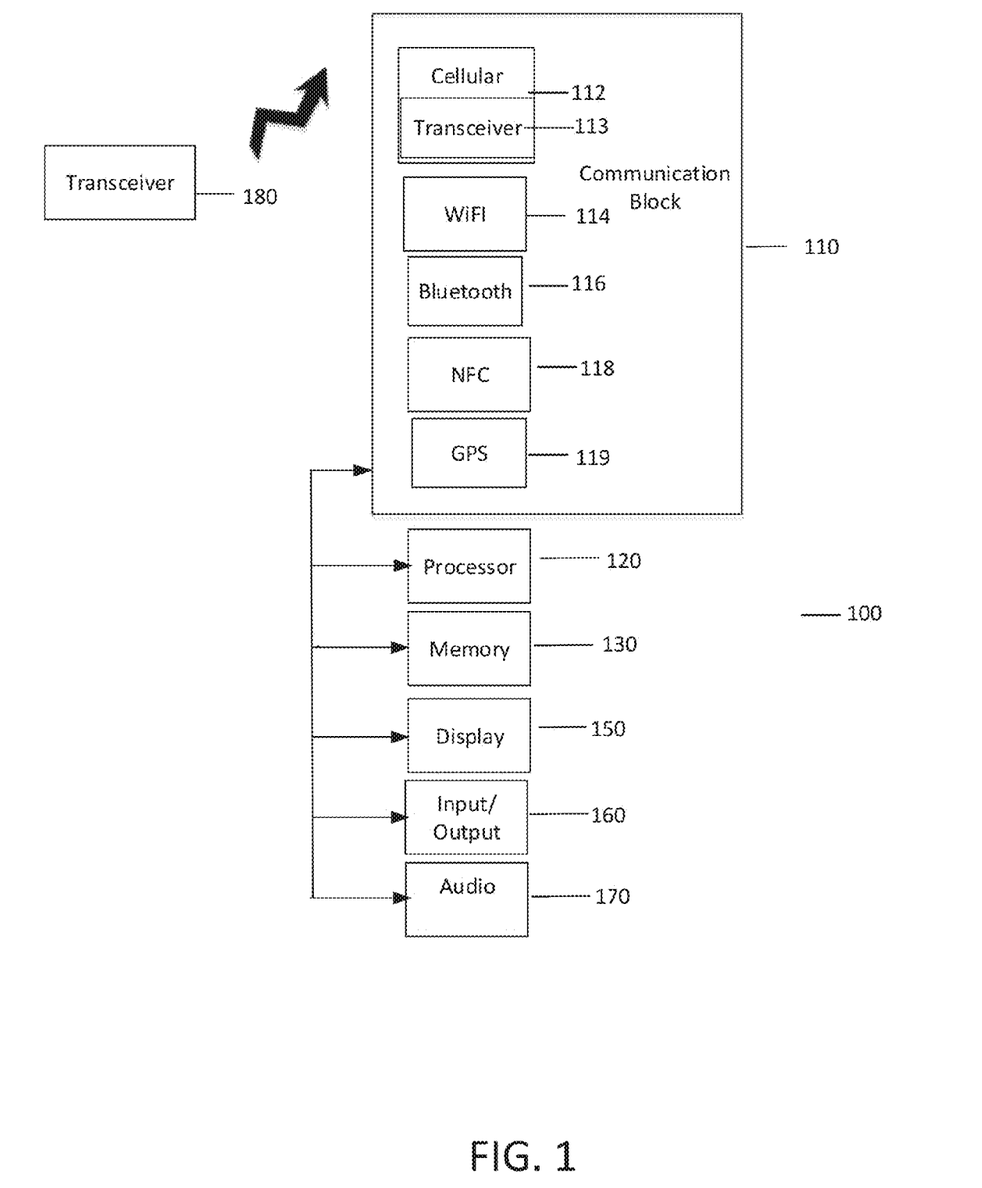
FIG. 1 is a block diagram of an electronic device in a network environment, according to an embodiment of the present disclosure.

FIG. 1 is a schematic block diagram of an electronic device in a network environment, according to an embodiment of the present disclosure.

In FIG. 1, an electronic device 100 in a network environment, according to an embodiment of the present disclosure, includes, but is not limited to, a communication block 110, a processor 120, a memory 130, a display 150, an input/output block 160, an audio block 170 and a transceiver 180.

The communication block 110 connects the device 100 to another electronic device or a network for communication of voice and data. The communication block 110 provides wide area, local area, personal area, near field, device to device (D2D), machine to machine (M2M) and short range communications. The functions of the communication block 110, or a portion thereof, may be implemented by a chipset. In particular, the cellular communications block 112 provides a wide area network connection through terrestrial base transceiver stations or directly to other electronic devices, using technologies such as D2D, M2M, long term evolution (LTE), 5$^{th}$ generation (5G), long term evolution advanced (LTE-A), code division multiple access (CDMA), wideband code division multiple access (WCDMA), universal mobile telecommunications system (UMTS), wireless broadband (WiBro), and global system for mobile communication (GSM). The cellular communications block 112 includes, but is not limited to, a chipset and a transceiver 113. The transceivers 113 and 180 may include at least one of a processor, a transmitter, a receiver, a low noise amplifier, a demodulator, a detector, a descrambler, a deinterleaver, a digital predistortion lookup table, a radio frequency integrated circuit (RFIC), a capture memory, a digital to analog converter (DAC), an analog to digital converter (ADC), a power supply modulator and a power amplifier (PA). The wireless fidelity (WiFi) communications block 114 provides a local area network connection through network access points using technologies such as IEEE 802.11. The Bluetooth communications block 116 provides personal area direct and networked communications using technologies such as IEEE 802.15. The near field communications (NFC) block 118 provides point to point short range communications using standards such as ISO/IEC 14443. The communication block 110 also includes, but is not limited to, a GPS satellite signal receiver 119. The GPS receiver 119 provides for receiving Global Positioning System signals in order to compute the device's absolute position, velocity, acceleration and time. The electronic device 100 may receive electrical power for operating the functional blocks from a power supply, including, but not limited to, a battery. The transceiver 180 may be a part of a terrestrial base transceiver station (such as a cellular base station (BTS)) and may include a radio frequency transmitter and receiver conforming to cellular standards.

The processor 120 provides application layer processing functions required by the user of the electronic device 100. The processor 120 also provides command and control functionality for the various blocks in the electronic device 100. The processor 120 provides for updating control functions required by the functional blocks. The processor 120 may provide for coordination of resources required by the transceiver 113 including, but not limited to, communication control between the functional blocks. The processor 120 may also update the firmware, databases, lookup tables and libraries associated with the transceiver 113. The cellular communications block 112 may also have a local processor or a chipset which dedicates computing resources to the transceiver 113 and other functional blocks required for cellular communication.

The memory 130 provides storage for device control program code, user data storage, application code and data storage. The memory 130 may provide data storage for the firmware, libraries, databases, lookup tables and calibration data required by the transceiver 113. The databases also may include look up tables, and the like. The program code and databases required by the transceiver 113 may be loaded into local storage within the transceiver 113 from the memory 130 upon device boot up. The transceiver 113 may also have local non-volatile memory for storing the program code, libraries, databases and lookup table data.

The display 150 may include a liquid crystal display (LCD), a light emitting diode (LED) display, an organic light emitting diode (OLED) display, a microelectromechanical system (MEMS) display, or an electronic paper display, and display various content, such as text, image, video, icon, or a symbol to the user. The display 150 may include a touch screen that receives a touch input, a gesture input, a proximity input, or a hovering input that is made using an electronic pen or a part of the user's body. The input/output block 160 controls the interface to the user of the electronic device 100. The audio block 170 provides for audio input and output to/from the electronic device 100.

Figure 2:
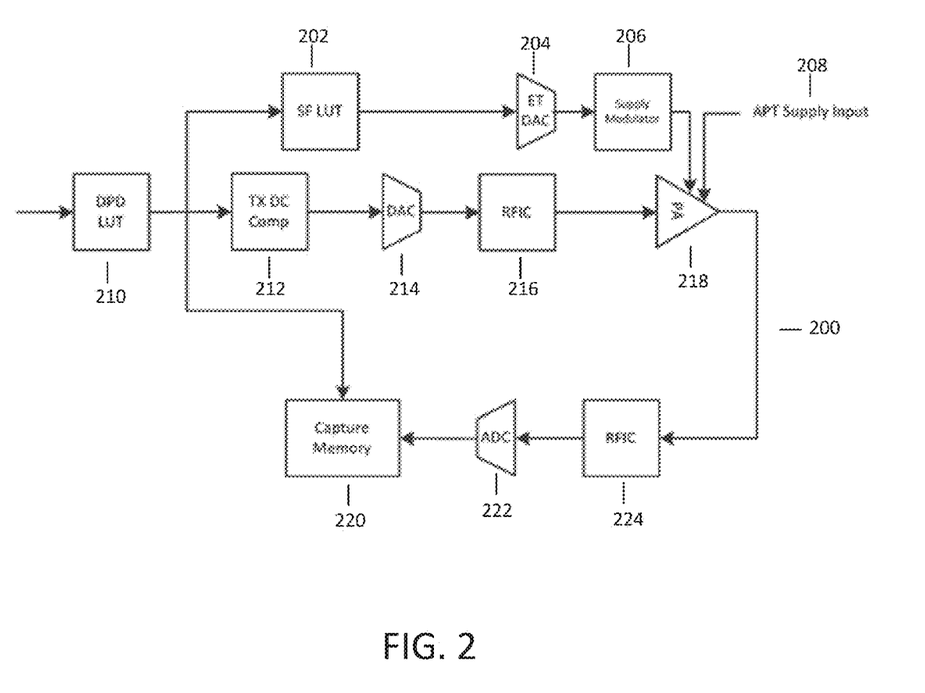
FIG. 2 is a block diagram of a portion of a radio frequency transceiver, according to an embodiment of the present disclosure.

FIG. 2 is a block diagram of a portion of a radio frequency transceiver, according to an embodiment of the present disclosure.

Referring to FIG. 2, the radio frequency transceiver 200 may be a part of a terrestrial base transceiver station 180, or a part of the electronic device 100. The radio frequency transceiver 200 includes a shaping function (SF) lookup table (LUT) 202, an envelope tracking (ET) digital to analog converter (DAC) 204, a power supply modulator 206, an average power tracking (APT) supply input 208, a digital pre-distortion (DPD) look up table (LUT) 210, a transmit (TX) direct current (DC) compensation unit 212, a digital to analog converter 214, a radio frequency integrated circuit (RFIC) 216, a power amplifier (PA) 218, a capture memory 220, an analog to digital converter (ADC) 222, and a radio frequency integrated circuit (RFIC) 224. According to an embodiment of the present disclosure, some or all of the components 202 to 224 of the radio frequency transceiver 200 may be integrated into a single integrated circuit or package.

According to an embodiment of the present disclosure, the SF look up table (LUT) 202 may provide a sequence of digital data to the ET DAC 204. The SF LUT 202 may be a memory storage device. The envelope tracking (ET) digital to analog converter (DAC) 204 receives the sequence of digital data from the SF LUT 202 and provides a programmable time varying voltage to the power supply modulator 206. The power supply modulator 206 supplies power to the power amplifier 218. The ET DAC 204 and the supply modulator 206 supply a power supply voltage to the PA 218 that is continuously adjusted to ensure that the amplifier is operating at peak efficiency for the power required at each instant of RF transmission to enable envelope tracking of the PA 218. Envelope tracking adjusts the voltage applied to an RF power amplifier to deliver the power needed at that instant minimizing the effects of waveforms that have a high peak to average ratio. Envelope information is derived from a baseband modem and provided to the SF LUT 202. The APT supply input 208 may also supply power to the PA 218. The APT supply input 208 operates in a similar manner to the power supply modulator 206 by supplying a time varying power supply to the PA 218 to increase the efficiency of the PA 218 as compared to a non-time varying constant voltage supply. However, the APT supply input 208 operates at a slower time variation compared to the dynamic modulation of the power supply modulator 206.

Digital predistortion is a method used to improve the linearity of a radio frequency (RF) transmitter PA. An RF PA is required to operate in an effectively linear manner in order to accurately reproduce the signal present at the PA input. A PA that compresses its input, or has a non-linear input/output relationship, causes the output signal to be emitted onto adjacent radio frequencies causing spectral re-growth and interference on other radio channels. The digital predistortion method effectively linearizes the output by compensating for the non-linearity of the PA by predicting the magnitude of errors caused by the non-linearity of the PA.

The digital pre-distortion (DPD) lookup table (LUT) 210 may provide the compensating factors which when applied to the signals to be transmitted by the PA effectively create a linear output from the PA 218. The DPD LUT 210 may be a memory storage device. According to an embodiment of the present disclosure, the compensating factors stored in the DPD LUT 210 are determined by the frequency-domain weighted least squares regression method described below. Signals from the baseband modem, which are designated for transmission over the air, are provided to the DPD LUT 210. The DPD LUT 210 outputs signals compensated for PA 218 non linearity which are then provided to the TX DC compensation unit 212. A DC offset may occur in the transmission path caused by the DAC 214 or other components in the direct conversion process from baseband to radio frequency.

Without proper compensation, DC offset may cause the receiver of the transmitted RF signals to obtain biased estimates of important parameters for signal demodulation and detection. Since the constellation of high order modulation (such as the modulation of LTE and LTE-A) is denser than that of modulation such as binary phase shift keying (BPSK) modulation, the performance loss due to DC offset in 16-ary or 64-ary quadrature amplitude modulation is worse than that in BPSK modulation. The TX DC compensation unit 212 compensates for this DC offset by biasing the signal level provided to the DAC 214 with a value that effectively cancels the DC offset in the transmission path. The DAC 214 converts the DC offset compensated signal from the TX DC compensation unit 212 into an analog signal. The RFIC 216 receives the analog signal from the DAC 214 and converts the baseband signal into an RF signal. The RFIC 216 modulates the analog signal according to the requirements of the wireless communication method desired to be transmitted and provides the modulated RF signal to the PA 218. The PA 218 may be an RF PA that converts a low-power radio-frequency signal into a higher power signal. The output of the PA 218 is provided (fed back) to the RFIC 224 and may also drive an antenna directly for transmission of the RF signal over the air, or may be provided to other components such as filters or switches before driving the antenna.

The non-linearity of the PA 218 may be compensated for by the methods disclosed below. The RFIC 224 converts the output of the PA 218 or a signal received by an antenna from an RF signal into a baseband signal. The RFIC 224 may be the same as, or similar to, the RFIC 216. The ADC 222 converts the analog signal from the RFIC 224 into a digital signal. The capture memory 220 may be a data storage device that captures data from the ADC 222. Certain data from the capture memory 220 may also be stored in the DPD LUT 210. The capture memory 220, the DPD LUT 210 and the SF LUT 202 may be embodied in a single memory device or multiple memory devices. The capture memory 220 may store test set data, training set data, validation set data, PA 218 output samples converted by the ADC 222 into digital data, or any combination thereof.

The PA 218 may have a non-linearity with respect to the relationship between the input and output signals of the PA 218. According to an embodiment of the present disclosure, compensating for the non-linear relationship includes determining a model for the input and output signal relationship, determining the inverse function of the input and output signal relationship and applying that inverse function to input signals before transmission through the PA 218. Compensation for the PA 218 non-linearity enhances the EVM and ACLR parameters of the transceiver 200. The model for determining the input and output signal relationship may include a memory polynomial (MP) generated using a least squares regression analysis method. The method of least squares regression analysis generates an approximate solution of the overdetermined system. The least squares regression method seeks to minimize the sum of the squares of the errors made in the results of every equation that models the input and output signal relationship of the PA 218.

Equation (1) below is a memory polynomial which may be used for PA 218 forward or inverse modeling estimation:

$$y_{MP}(t) = \sum_{k=0}^{K} \sum_{m=0}^{M-1} a_{km} u(t-\tau_m) |u(t-\tau_m)|^{2k} \quad (1)$$

where u(t) is a baseband PA input signal and $y_{MP}(t)$ is a PA output signal. A standard least squares regression method may be used to estimate coefficients ($a_{km}$) of the memory polynomial of Equation (1).

The PA 218 may operate close to its saturation region in which its input and output signal relationship is highly non-linear. In this case, the MP based on the least squares regression analysis method may be of a higher order to compensate for the increased non-linearity in the near saturated operating region. However, a higher order MP generated using least squares regression analysis may result in overfitting and an overly complex, less accurate model with poor predictive performance. Overfitting may occur when a model begins to "memorize" the training data rather than "learning" to generalize from the trending of the data. Improving (lowering) EVM may also lower ACLR but they are not always correlated in a least squares regression analysis method. The least squares regression analysis method may undesirably degrade the ACLR while improving the EVM. According to an embodiment of the present disclosure, a frequency-domain weighted least squares regression analysis method may determine a digital predistortion model which compensates for the non-linearity of PA 218 while balancing the requirements of both EVM and ACLR values. In particular, the present method improves (lowers) ACLR while minimizing the impact on EVM. The present method also exhibits less overfitting error using a higher order MP as compared to a standard least squares regression method.

Figure 3:
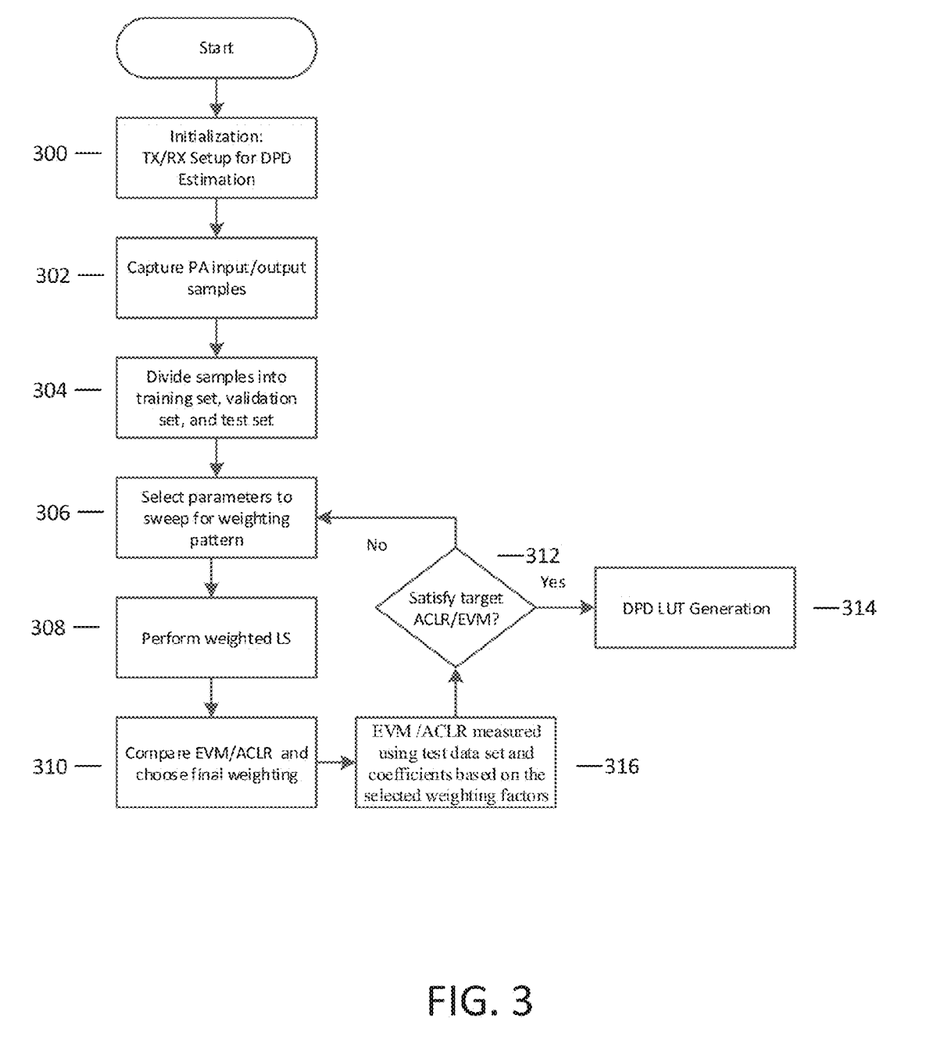
FIG. 3 is a flowchart illustrating an operation of a frequency-domain weighted least squares regression analysis method, according to an embodiment of the present disclosure.

FIG. 3 is a flowchart illustrating an operation of a frequency-domain weighted least squares regression analysis method, according to an embodiment of the present disclosure.

The flowchart of FIG. 3 illustrates the steps of an operation for generating a digital predistortion model which compensates for the non-linearity of PA 218 using a frequency-domain weighted least squares regression analysis method. Referring to FIG. 3, at 300, the transceiver 200 as described in FIG. 2 is initialized. The initialization of the transceiver 200 may include the processor 120 executing program code stored in the memory 130 which initializes registers in transceiver 200 components 202 through 220 to prepare the transceiver 200 for executing the steps required for generating a digital predistortion model.

At 302, input and output data samples are generated and stored in the capture memory 220. Input data samples are provided to the TX DC compensation unit 212 which then provides DC offset compensated input data samples to the DAC 214, which converts the data samples to a continuous analog signal and provides the analog signal to the RFIC 216 which mixes and upconverts the analog signal with a carrier frequency to create an RF signal, which is provided to the PA 218, which amplifies the signal. The amplified RF signal is provided (fed back) to the RFIC 224 which downconverts the RF signal to an analog signal, which is then converted to a digital data output sample by the ADC 222. The data output sample is then stored in capture memory 220 along with the data input samples. Each data input sample is correlated to the corresponding data output sample.

In 304, the input and output data samples are divided into categories of a training data set, a validation data set and a test data set. The training data set is used to determine the input and output signal relationship of the PA 218. The validation data set is a set of data which is different from the training data set and is used to validate the performance of the model developed using the training data set. The validation data set may also be used to further refine the performance of the model. The test data set is different from both the training and validation data sets and is used to test the predictive performance and accuracy of the model.

In 306, parameters are selected as candidates for the weighting pattern. The parameters may include ACLR/noise boundaries, boosting factor for ACLR/noise area, and boosting shape.

In 308, a weighted least squares regression analysis method is also performed for the parameter(s) selected in 306 using the training data set. Digital predistortion compensation is then performed on the validation data set using the estimated polynomial coefficients based on the weighted least squares regression analysis for each of the selected parameters.

In 310, the EVM and ACLR are measured and the values are compared to the set criteria for acceptable EVM and ACLR values for each parameter of weighting factor, and a desired final weighting according to the EVM and ACLR comparisons is selected.

In 316, EVM and ACLR are measured and evaluated using the test data set and the polynomial coefficients based on the selected weighting factors determined in 310.

In 312, a determination is made whether the final EVM and ACLR values satisfy the set target requirements for these parameters. If the final values do not satisfy the set target, the operation returns to 306 to select different parameters to use for selecting the weighting pattern. If the final EVM and ACLR values satisfy the set target requirements, the operation proceeds to 314.

In 314, the DPD LUT data is generated using the polynomial and coefficients determined to satisfy the set target requirements for EVM and ACLR in 312.

Figure 4:
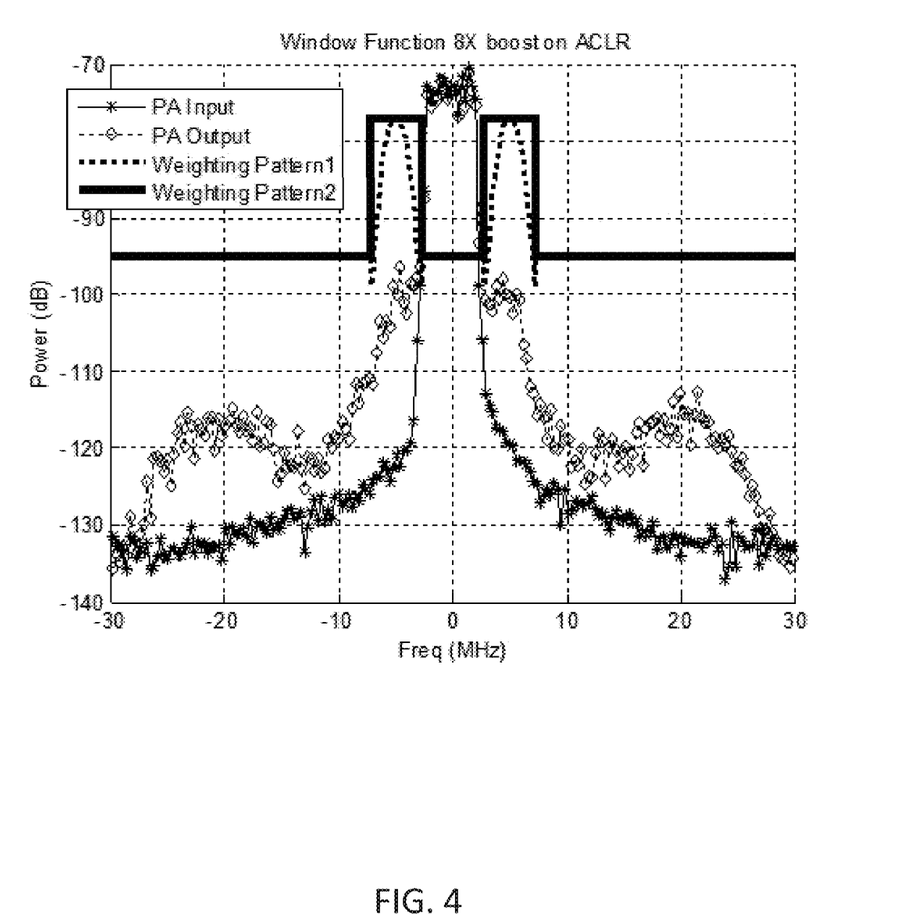
FIG. 4 illustrates a power spectral density plot of a window function, according to an embodiment of the present disclosure.

FIG. 4 illustrates a power spectral density plot of a window function, according to an embodiment of the present disclosure.

Referring to FIG. 4, the horizontal axis represents the offset frequency in MHz from the center of the carrier frequency at which the PA 218 transmits. The in-band region corresponds to a bandwidth of 5 MHz. The ACLR regions to the left and right of the in-band region are adjacent frequency regions with the same bandwidth as the in-band. The regions outside the in-band and ACLR regions are considered to be noise regions. The out of band regions are a combination of the ACLR and noise regions. The boundaries between the in-band region, the ACLR regions, the noise regions and the out of band regions may be adjusted according to system level requirements.

According to an embodiment of the present disclosure, the frequency weighting functions may boost ACLR regions or out of band regions. A boosting function in regression analysis is a technique that increases the predictive accuracy of models that include a boosting function. Weighting functions that may boost the ACLR regions or out of band regions include boosting functions with a rectangular, triangular, Hamming, bell or other shaped function. The boosting function may be designed to target optimization of ACLR, EVM or a balance between the two. The present method searches for one or more window functions that maximize ACLR while ensuring an upper bound on EVM is not exceeded. The present method may also search for a window function that minimizes EVM while maintaining a given ACLR. The noise region may further be boosted as the ACLR region in order to utilize nonlinear components mixed in the noise region. The noise region may also be de-boosted to avoid noisy estimation of the model. The present system may also combine any weighting factor on the noise region while boosting the ACLR region.

The present method parameterizes the window function based on different parameters including, but not limited to, ACLR region boundaries, noise region boundaries, ACLR boosting factor, and noise region boosting factor. The boosting region shape may be parametrized by different shapes such as rectangular, Hamming, triangular, sinusoidal or sigmoid. The parameterized window function may be swept to select the optimal window parameters that maximize ACLR, minimize EVM, or provide a desired balance between the two.

According to an embodiment of the present disclosure, the present method improves ACLR over a standard least squares regression method. The EVM loss from boosting an out of band portion or the ACLR portion may be controlled by the boosting factor. The present method reduces the potential problem of overfitting a higher-order MP by boosting an out of band or ACLR region.

According to an embodiment of the present disclosure, for frequency-domain optimization of the predictive model of the PA 218, the present method requires additional operations corresponding to the fast Fourier transform (FFT) of the time-domain signal, i.e., O(n log n), where O is the number of FFT operations, and n is the number of data samples used for estimation. For a time-domain optimization, the present method requires $O(n^2)$ additional operations for a convolutional matrix multiplication. Frequency-domain optimization may be more efficient in terms of computational complexity unless a shortened time-domain weighting pattern is used.

Figure 5:
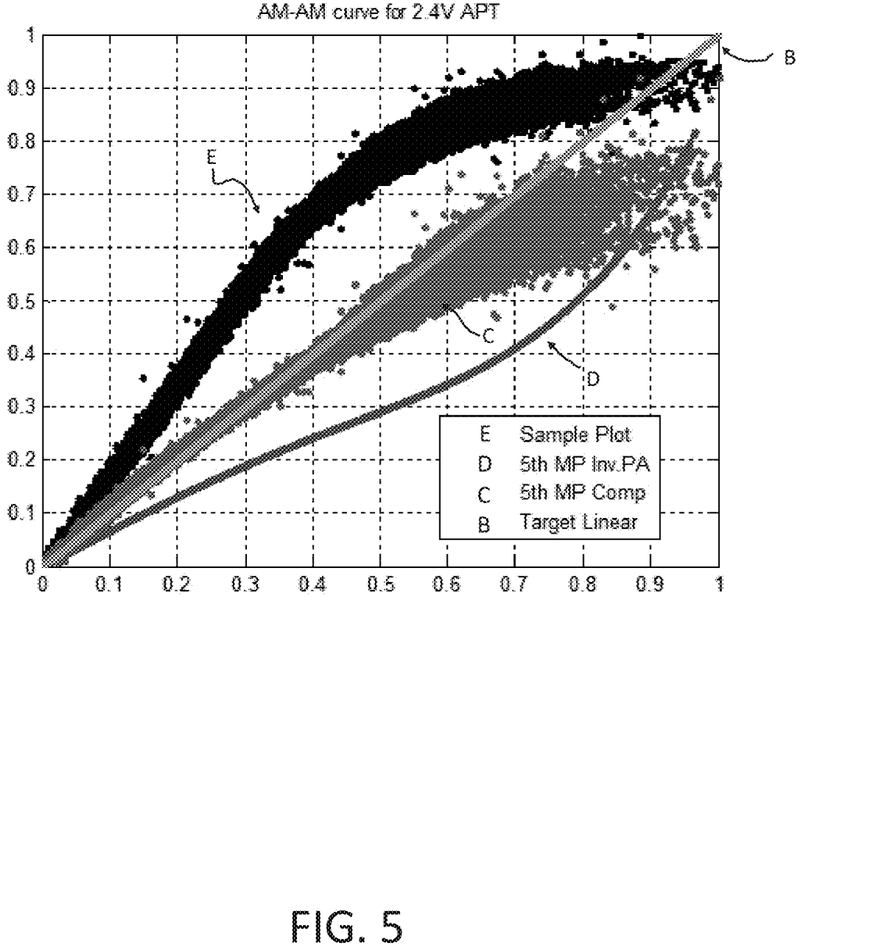
FIG. 5 illustrates a plot of amplitude-amplitude (AM)-(AM) curves for PA characterization, according to an embodiment of the present disclosure.

FIG. 5 illustrates a plot of amplitude-amplitude (AM)-(AM) curves for PA characterization, according to an embodiment of the present disclosure.

Referring to FIG. 5, the dots in region E represent AM-AM scatter plots of PA input/output data sample pairs and may be modelled as shown in Equation (2) below:

$$y_i = f(x_i) \quad (2)$$

where, $x_i$ is a PA 218 input data sample and $y_i$ is a PA 218 output data sample.

The inverse function of Equation (2) above may be estimated by a least squares regression analysis method and may generate curve D of FIG. 5 which may be modelled as shown in Equation (3) below:

$$\hat{x}_i = g(y_i) \quad (3)$$

The least squares regression method minimizes the following mean squares error (MSE) cost function as shown in Equation (4) below:

$$MSE = \frac{1}{N}\sum_{i=0}^{N-1} \|x_i - \hat{x}_i\|^2 = \frac{1}{N}\sum_{i=0}^{N-1} \|x_i - g(f(x_i))\|^2 \quad (4)$$

The MSE is the same as EVM squares which is defined in Equation (5) as:

$$EVM = \frac{\sqrt{\frac{1}{N}\sum_{i=0}^{N-1} \|x_i - f(g(x_i))\|^2}}{\max_i \|x_i\|} = \sqrt{MSE} \text{ if } \max_i \|x_i\| = 1 \quad (5)$$

where each $(x_i, g(f(x_i)))$ pair is illustrated as dots in FIG. 5 represented by region C representing the compensated linear input/output data samples of the PA 218 and $(x_i, x_i)$ corresponds to a target linear curve (curve B).

Equation (1) may be represented as vector multiplication as shown in Equations (6) and (7) below:

$$\hat{x} = Aa \quad (6)$$

$$MSE = \frac{1}{N}(x - \hat{x})^{*T}(x - \hat{x}) = \frac{1}{N}(x - Aa)^{*T}(x - Aa) \quad (7)$$

where $x = \begin{bmatrix} x_0 \\ x_1 \\ \vdots \\ x_{N-1} \end{bmatrix}, \hat{x} = \begin{bmatrix} \hat{x}_0 \\ \hat{x}_1 \\ \vdots \\ \hat{x}_{N-1} \end{bmatrix},$ $$A = \begin{bmatrix} y_0 y_0 \|y_0\|^2 & \cdots & y_0 \|y_0\|^{2p} \\ & \vdots & \\ y_{N-1} y_{N-1} \|y_{N-1}\|^2 & \cdots & y_{N-1} \|y_{N-1}\|^{2p} \end{bmatrix}, a = \begin{bmatrix} a_0 \\ \vdots \\ a_p \end{bmatrix}$$

and where a is a coefficients vector for polynomial, A is an input matrix for memory polynomial model, and 2p+1 is the order of polynomial.

Using Parseval's identity, Equation (1) may be expressed as a frequency-domain summation as shown in Equation (8) below:

$$MSE = \frac{1}{N}\sum_{i=0}^{N-1} \|x_i - \hat{x}_i\|^2 = \frac{1}{N^2}\sum_{k=0}^{N-1} \|X_k - \hat{X}_k\|^2 \quad (8)$$

where, $$X_k = \sum_{n=0}^{N-1} x_n e^{-j2\pi k \frac{n}{N}}$$

$$\hat{X}_k = \sum_{n=0}^{N-1} \hat{x}_n e^{-j2\pi k \frac{n}{N}}$$

Equation (8) may be simplified by vector representation as shown in Equations (9) and (10) below:

$$MSE = \frac{1}{N}(x - \hat{x})^{*T}(x - \hat{x}) = \frac{1}{N^2}(X - \hat{X})^{*T}(X - \hat{X}) \quad (9)$$

$$MSE = \frac{1}{N}(x - Aa)^{*T}(x - Aa) = \frac{1}{N^2}(Fx - FAa)^{*T}(Fx - FAa) \quad (10)$$

where, $X = \begin{bmatrix} X_0 \\ X_1 \\ \vdots \\ X_{N-1} \end{bmatrix}, \hat{X} = \begin{bmatrix} \hat{X}_0 \\ \hat{X}_1 \\ \vdots \\ \hat{X}_{N-1} \end{bmatrix}$ and F is a discrete Fourier transform (DFT) matrix.

Figure 6:
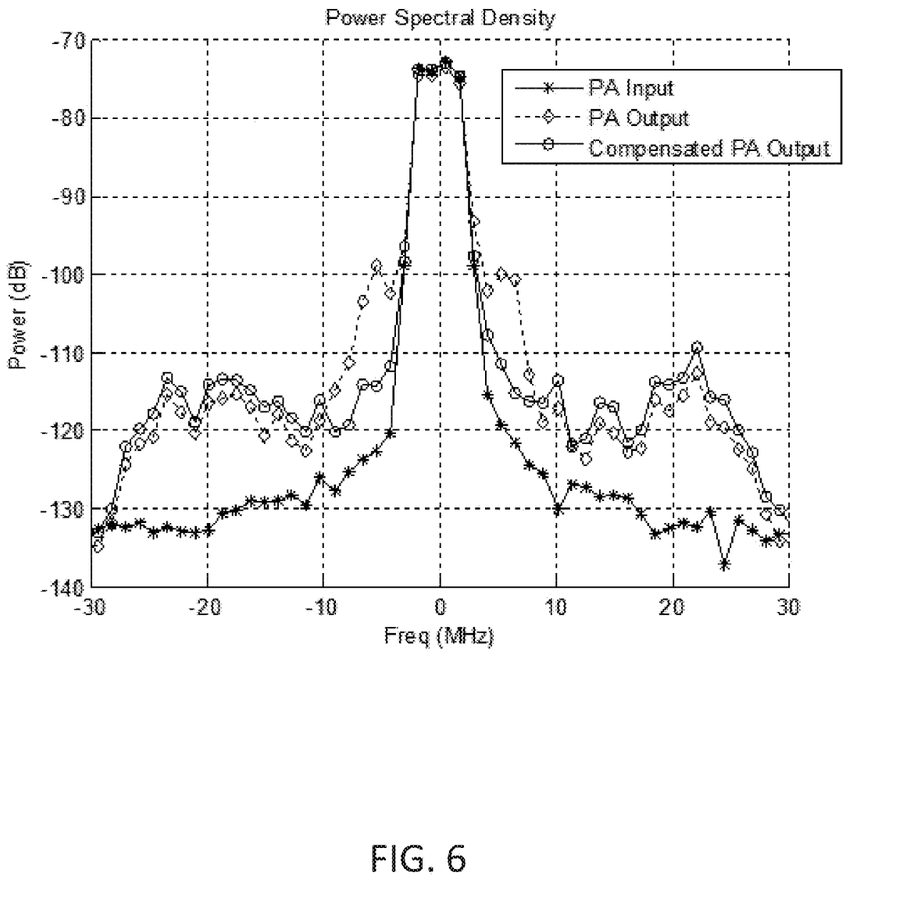
FIG. 6 illustrates a plot of power spectral density (PSD) of PA input, PA output, and compensated PA output, according to an embodiment of the present disclosure.

FIG. 6 illustrates a plot of power spectral density (PSD) of PA 218 input ($x_i$), PA 218 output ($g(x_i)$), and compensated PA 218 output ($f(g(x_i))$), according to an embodiment of the present disclosure. Equation (8) suggests that MSE (or EVM) is L2 norm (where L2 norm of a vector is the square root of the sum of the absolute values squared) of the spectrum difference between the PA 218 input and digital predistortion compensated PA 218 output. In other words, the least squares regression analysis method tries to minimize the spectrum difference between the PA 218 input and the PA 218 output, which corresponds to minimization of the EVM.

Therefore, minimizing the EVM may reduce the ACLR value because the ACLR region is a part of the frequency spectrum targeted for optimization, which improves the ACLR value. However, the amount of ACLR improvement depends on the power ratio between the in-band signal region and the ACLR regions. Since the in-band signal is usually much stronger than the ACLR region, the least squares regression analysis method focuses on reducing distortion in the in-band region. Therefore, the standard least squares regression analysis method may overlook an out of band distortion due to the high power difference between the in band and out of band regions.

Although nonlinear harmonics of the center frequency have the highest power concentration within the in-band region, they are mixed with a strong in-band linear signal. The present method boosts the power of the ACLR region or the out of band region to avoid overlooking the out of band distortion in the least squares regression estimation. The main benefit of boosting the ACLR region or out of band region is that estimation of higher order terms in the MP may be improved by properly balancing between the in-band and ACLR regions. Therefore, frequency-domain weighting that boosts the out of band or ACLR regions may improve the ACLR.

According to an embodiment of the present disclosure, a weighted least squares regression analysis method may improve the ACLR and EVM performance of the PA 218. In Equation (11), weights are multiplied on each summation term of Equation (8), as shown below:

$$MSE_{weighted\,LS} = \frac{1}{N^2}\sum_{k=0}^{N-1} W_k^2 \|X_k - \hat{X}_k\|^2 = \frac{1}{N^2}\sum_{k=0}^{N-1} \|W_k X_k - W_k \hat{X}_k\|^2 \quad (11)$$

where $W_k$ may be considered a spectrum window function.

A vector representation of Equation (11) is shown in Equation (12) below:

$$MSE_{weighted\,LS} = \frac{1}{N^2}(WX - W\hat{X})^{*T}(WX - W\hat{X}) = \\ \frac{1}{N^2}(WFx - WFAa)^{*T}(WFx - WFAa) \quad (12)$$

where, $W = \mathrm{diag}(W_0, W_1, \ldots, W_{N-1})$ and F is a DFT matrix.

Therefore, the frequency-domain solution for weighted least squares regression becomes Equation (13) as shown below:

$$a_{frequency\text{-}Weighted\,LS} = (A^{*T}F^{*T}W^2FA)^{-1}A^{*T}F^{*T}W^2Fx \quad (13)$$

An equivalent time-domain expression of Equation (13) is shown below in Equation (14):

$$MSE = \quad (14)$$
$$\frac{1}{N^2}(WFx - WFAa)^{*T}(WFx - WFAa) = \frac{1}{N}(Cx - C\hat{x})^{*T}(Cx - C\hat{x})$$

$$\text{where } C = \begin{bmatrix} w_0 0 0 \ldots w_{M-1} \ldots w_2 w_1 \\ w_1 w_0 0 0 \ldots w_{M-1} \ldots w_2 \\ \vdots \\ 0 0 \ldots w_{M-1} \ldots w_2 w_1 w_0 \end{bmatrix}$$

and $w_i$ is time-domain coefficient of frequency-domain weights $W_i$.

The time-domain least squares regression analysis method may be represented by Equation (15) below:

$$a_{time\text{-}Weighted\,LS} = (A^{*T}C^{*T}CA)^{-1}A^{*T}C^{*T}Cx \quad (15)$$

The time-domain solution represented by Equation (13) is equivalent to the frequency-domain solution represented by Equation (15). The choice of a time-domain solution or a frequency-domain solution may depend on computational complexity of the solution and the computing resources available. The computational complexity of Equation (15) depends on the length of time-domain coefficients M. M is a design parameter chosen by truncating time-domain coefficients of the weighting pattern. If M is much smaller than N, Equation (15) may be more computationally efficient than Equation (13) due to the sparsity of the matrix. However, M may not be arbitrarily small because it may distort the original weighting pattern, which may degrade estimation performance.

Figure 7:
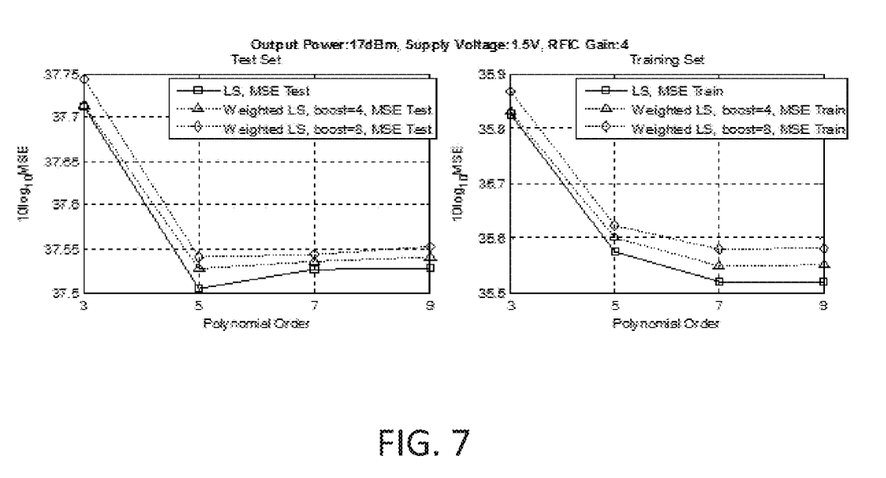
FIG. 7 illustrates plots of memory polynomial order versus ACLR determined by mean squares error (MSE) for a test data set and a training data set, according to an embodiment of the present disclosure.
Figure 8:
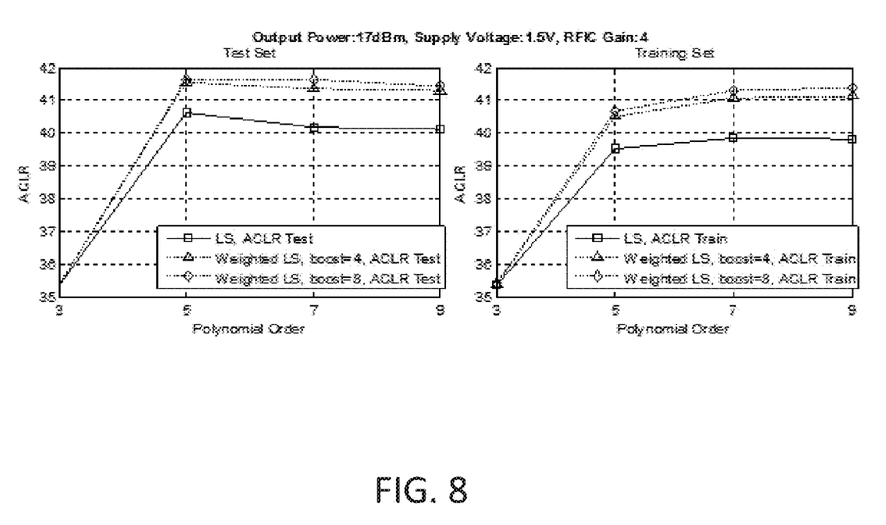
FIG. 8 illustrates plots of memory polynomial order versus ACLR determined by ACLR for a test data set and a training data set, according to an embodiment of the present disclosure.

FIG. 7 illustrates plots of memory polynomial order versus ACLR determined by MSE for a test data set and a training data set for a PA input power/RFIC gain of 4 and a power supply voltage of 1.5V, according to an embodiment of the present disclosure. FIG. 8 illustrates plots of memory polynomial order versus ACLR, for a test data set and a training data set for a PA input power/RFIC gain of 4 and a power supply voltage of 1.5V.

Figure 9:
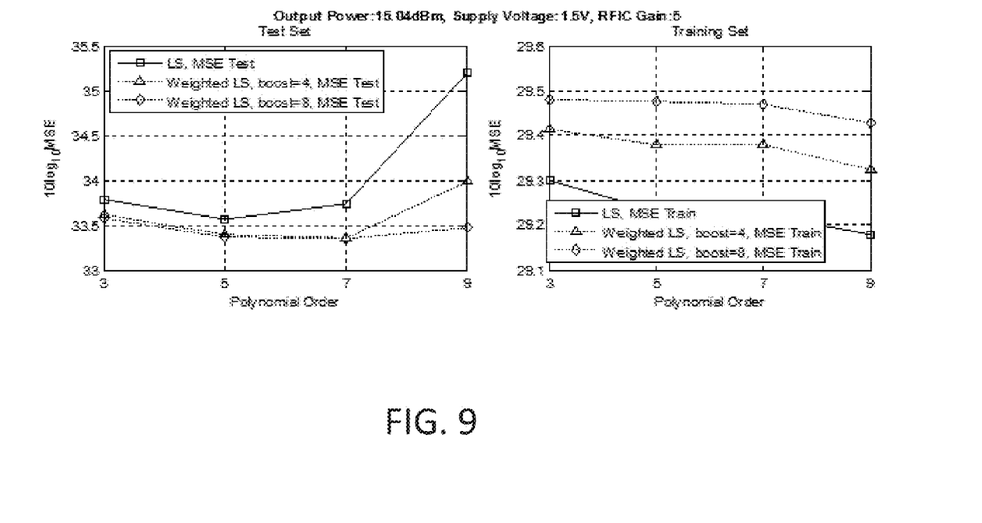
FIG. 9 illustrates plots of memory polynomial order versus MSE determined by MSE for a test data set and a training data set, according to an embodiment of the present disclosure.
Figure 10:
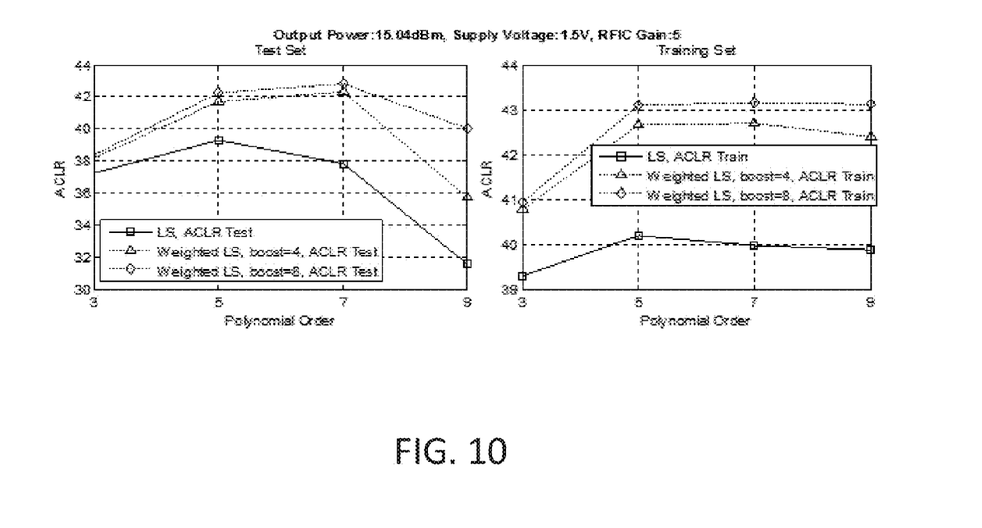
FIG. 10 illustrates plots of memory polynomial order versus MSE determined by ACLR for a test data set and a training data set, according to an embodiment of the present disclosure.

FIG. 9 illustrates plots of memory polynomial order versus 10 log MSE determined by MSE for a test data set and a training data set for an RFIC gain of 5 and a supply voltage of 1.5V. FIG. 10 illustrates plots of memory polynomial order versus 10 log MSE for a test data set and a training data set for an RFIC gain of 5 and a power supply voltage of 1.5 V.

For each plot in FIGS. 7-10, three boosting factors are used: 2×, 4×, and 8×. The training data set is only used for estimation of polynomial coefficients. A separate test data set is used to evaluate the generalization performance of the predictive model. The frequency weighted least squares regression is performed only for coefficient estimation. MSE and ACLR results for test and training data sets are calculated based on their original definition without any weighting.

The plots of FIG. 7 and FIG. 9 show that the MSE difference between standard and weighted least squares regression becomes smaller for the test data set and the difference is less than 0.05 dB. In particular, FIG. 9 shows the inversion of MSE performance for the test data set. Therefore, the degradation of MSE from weighted least squares regression is not significant. Furthermore, by adjusting the boosting factor, the impact on MSE may be controlled.

The plots of FIG. 8 and FIG. 10 show a comparison of ACLR performance for the test data set and the training data set. The weighted least squares regression consistently shows better ACLR over standard least squares regression for all polynomial orders tested using the test data set and the training data set. The polynomial order of 7 for weighted least squares regression shows improved ACLR but standard least squares regression shows predictive performance degradation (due to overfitting of the model). For a polynomial order of 9, predictive performance degradation resulting from the weighted least squares regression is much smaller than that from standard least squares regression.

While the present disclosure has been particularly shown and described with reference to certain embodiments thereof, it will be understood by those of ordinary skill in the art that various changes in form and details may be made therein without departing from the spirit and scope of the present disclosure as defined by the following claims and their equivalents.

What is claimed is:

1. A method, comprising:
    determining a training data set comprising input and output data of a power amplifier;
    determining compensation data by regressing the training data set using a frequency-domain weighting function, wherein the frequency-domain weighting function is adjusted according to a target value of at least one of an adjacent channel leakage ratio (ACLR) region and an error vector magnitude (EVM), and wherein the frequency-domain weighting function includes a window that is parameterized by at least one of an ACLR region boundary, a noise region boundary, an ACLR boosting factor, and a noise region boosting factor;
    storing the compensation data; and
    linearizing an output of the power amplifier using the stored compensation data.

2. The method of claim 1, wherein the frequency-domain weighting function boosts at least one of the ACLR region, an out of band region, and a noise region.

3. The method of claim 2, wherein the window is in a shape of at least one of rectangular, Hamming, triangular, bell, sinusoid, and sigmoid.

4. The method of claim 1, wherein the frequency-domain weighting function is adjusted according to a target value of both the ACLR region and the EVM.

5. The method of claim 1, wherein power is supplied to the power amplifier by at least one of envelope tracking (ET) or average power tracking (APT).

6. The method of claim 1, wherein the compensation data is stored in a look up table (LUT).

7. The method of claim 1, wherein regressing the training data comprises determining coefficients of a memory polynomial using a least squares regression analysis.

8. The method of claim 2, wherein a power spectral density of the power amplifier output is less than a power spectral density of a non-compensated power amplifier output in the ACLR region.

9. The method of claim 1, wherein the output of the power amplifier comprises a wireless signal associated with at least one of device to device (D2D), machine type communications (MTC), fifth generation (5G), long term evolution (LTE), long term evolution advanced (LTE-A), code division multiple access (CDMA), wideband code division multiple access (WCDMA), universal mobile telecommunications system (UMTS), wireless broadband (WiBro), global system for mobile communications (GSM), wireless fidelity (Wi-Fi), Bluetooth, and near field communications (NFC).

10. An electronic device, comprising:
    a power amplifier;
    a storage; and
    a processor configured to:
        determine a training data set comprising input and output data of the power amplifier,
        determine compensation data by regressing the training data set using a frequency-domain weighting function, wherein the frequency-domain weighting function is adjusted according to a target value of at least one of an adjacent channel leakage ratio (ACLR) region and an error vector magnitude (EVM), and wherein the frequency-domain weighting function includes a window that is parameterized by at least one of an ACLR region boundary, a noise region boundary, an ACLR boosting factor, and a noise region boosting factor,
        store the compensation data in the storage, and
        linearize an output of the power amplifier using the stored compensation data.

11. The device of claim 10, wherein the frequency-domain weighting function boosts at least one of the ACLR region, an out of band region, and a noise region.

12. The device of claim 11, wherein the window is in a shape of at least one of rectangular, Hamming, triangular, bell, sinusoid, and sigmoid.

13. The device of claim 10, wherein the frequency-domain weighting function is adjusted according to a target value of both the ACLR region and the EVM.

14. The device of claim 10, wherein power is supplied to the power amplifier by at least one of envelope tracking (ET) or average power tracking (APT).

15. The device of claim 10, wherein the compensation data is stored in a look up table (LUT).

16. The device of claim 10, wherein regressing the training data comprises determining coefficients of a memory polynomial using a least squares regression analysis.

17. The device of claim 10, wherein the output of the power amplifier comprises a wireless signal associated with at least one of device to device (D2D), machine type communications (MTC), fifth generation (5G), long term evolution (LTE), long term evolution advanced (LTE-A), code division multiple access (CDMA), wideband code division multiple access (WCDMA), universal mobile telecommunications system (UMTS), wireless broadband (WiBro), global system for mobile communications (GSM), wireless fidelity (Wi-Fi), Bluetooth, and near field communications (NFC).

18. A chipset, the chipset configured to:
    determine a training data set comprising input and output data of a power amplifier,
    determine compensation data by regressing the training data set using a frequency-domain weighting function, wherein the frequency-domain weighting function is adjusted according to a target value of at least one of an adjacent channel leakage ratio (ACLR) region and an error vector magnitude (EVM), and wherein the frequency-domain weighting function includes a window that is parameterized by at least one of an ACLR region boundary, a noise region boundary, an ACLR boosting factor, and a noise region boosting factor,
    store the compensation data in a storage, and
    linearize an output of the power amplifier using the stored compensation data.

* * * * *